United States Patent
Katayama (10) Patent No.: US 7,444,421 B2
(45) Date of Patent: Oct. 28, 2008

(54) DATA STORAGE METHOD AND SYSTEM, DATA RECORDING CONTROLLING APPARATUS, DATA RECORDING COMMANDING APPARATUS, DATA RECEIVING APPARATUS, AND INFORMATION PROCESSING TERMINAL

(75) Inventor: Yasushi Katayama, Tokyo (JP)

(73) Assignee: Sony Corporation, Tokyo (JP)

( * ) Notice: Subject to any disclaimer, the term of this patent is extended or adjusted under 35 U.S.C. 154(b) by 835 days.

(21) Appl. No.: 10/483,606

(22) PCT Filed: May 7, 2003

(86) PCT No.: PCT/JP03/05715

§ 371 (c)(1), (2), (4) Date: Jan. 13, 2004

(87) PCT Pub. No.: WO03/096200

PCT Pub. Date: Nov. 20, 2003

(65) Prior Publication Data

US 2005/0076077 A1 Apr. 7, 2005

(30) Foreign Application Priority Data

May 14, 2002 (JP) ............................. 2002-139232

(51) Int. Cl.
*G06F 15/16* (2006.01)
(52) U.S. Cl. ..................... 709/232; 709/201; 709/204; 709/207; 370/474
(58) Field of Classification Search ................ 709/332, 709/201, 204, 208, 217, 218, 223–229, 232, 709/246, 207; 370/474; 364/200
See application file for complete search history.

(56) References Cited

U.S. PATENT DOCUMENTS 5,546,389 A * 8/1996 Wippenbeck et al. ....... 370/412

(Continued)

FOREIGN PATENT DOCUMENTS

JP 3-64141 3/1991

(Continued)

OTHER PUBLICATIONS

Rizzo L., Vicisano L. Reliable Multicast Data Distribution Protocol based on software FEC techniques Proc. of the Fourth IEEE HPCS'97 Workshop, Chalkidiki, Grece, [Online], Jun. 1997.

(Continued)

*Primary Examiner*—Saleh Najjar
*Assistant Examiner*—Marie Georges Henry
(74) *Attorney, Agent, or Firm*—Finnegan, Henderson, Farabow, Garrett & Dunner, L.L.P.

(57) ABSTRACT

A distributed storage system having n nodes ($20_1$), ($20_2$), ..., ($20_n$), a recording commanding device (10) for commanding recording of data in each node, and a transmission commanding device (30) for reading out the data recorded in the respective nodes. These nodes and the devices are interconnected over a network. The recording commanding device (10) applies FEC coding, with the coding rate of q/p, to data composed of p blocks, to generate q blocks, and appends a recording probability a, recorded by the node, to the data, to send out the resulting data to the network. In readout, the transmission commanding device (30) responds data to which has been appended the response probability β in responding the data.

19 Claims, 10 Drawing Sheets

| HEADER | RESPONSE PROBABILITY SECTION | REQUEST SECTION | FOOTER |
|---|---|---|---|
| 51 | 52 | 53 | 54 |

50

U.S. PATENT DOCUMENTS

| | | | |
|---|---|---|---|
| 5,886,647 A * | 3/1999 | Badger et al. | 340/825.69 |
| 6,088,407 A * | 7/2000 | Buternowsky et al. | 375/347 |
| 6,237,092 B1 * | 5/2001 | Hayes, Jr. | 713/100 |
| 6,381,629 B1 * | 4/2002 | Lee | 709/201 |
| 6,888,824 B1 * | 5/2005 | Fang et al. | 370/359 |
| 2001/0016079 A1 * | 8/2001 | Goyal et al. | 382/251 |
| 2002/0009051 A1 * | 1/2002 | Cloonan | 370/232 |
| 2002/0057717 A1 * | 5/2002 | Mallory | 370/503 |
| 2002/0059444 A1 * | 5/2002 | Shinno | 709/232 |
| 2002/0111804 A1 * | 8/2002 | Choy et al. | 704/233 |
| 2003/0007487 A1 * | 1/2003 | Sindhushayana et al. | 370/390 |
| 2003/0137994 A1 * | 7/2003 | Kikuchi | 370/474 |

FOREIGN PATENT DOCUMENTS

| | | |
|---|---|---|
| JP | 2000-155712 | 6/2000 |
| JP | 2002-500393 | 1/2002 |
| JP | 2003-517221 | 5/2003 |
| WO | WO 99/34291 | 7/1999 |
| WO | WO 00/31945 | 6/2000 |

OTHER PUBLICATIONS

T. Noguchi, M. Yamamoto, H. Ikeda, Reliable Multicast Protocol Applied Local FEC ICC2001, [Online], 2001.

* cited by examiner

DATA STORAGE METHOD AND SYSTEM, DATA RECORDING CONTROLLING APPARATUS, DATA RECORDING COMMANDING APPARATUS, DATA RECEIVING APPARATUS, AND INFORMATION PROCESSING TERMINAL

TECHNICAL FIELD

This invention relates to a data storage method and a data storage system, a data recording controlling apparatus, a data recording commanding apparatus, a data receiving apparatus and an information processing terminal, and more specifically to a data storage method and a data storage system for storing data distributed in plural nodes interconnected over a network. More particularly, it relates to a data recording controlling apparatus, a data recording commanding apparatus, a data receiving apparatus and an information processing terminal that may be conveniently used in this data storage system.

This application claims priority of Japanese Patent Application No.2002-139232, filed in Japan on May 14, 2002, the entirety of which is incorporated by reference herein.

BACKGROUND ART

Recently, a large scale storage system, in which data is distributed and recorded in a large number of information processing terminals interconnected over a network. In this distributed storage system, a server for recording and managing data transmits data to information processing terminals or to other servers, by e.g. multi-cast, for recording on local recording mediums provided in the information processing terminals or other servers.

If, in this case, data is to be taken out on demand, a large amount of data must be recorded in the recording medium. For example, if data is a motion picture, with the data capacity of approximately 2 Gbytes, and 500 of such motion pictures are to be recorded, the capacity not less than 1 terabyte is needed.

On the other hand, if, as an example of providing data by streaming, the server provides data to a client which requests the data by uncast, a protocol is used, in which re-transmission of data, such as an arrival complete signal (ACK signal) of TCP/IP, is requested for achieving error-free transmission.

However, this technique imposes significant load on the server, so that, in the current status of the art, services can be rendered to only hundreds of clients even if a high performance server is used. Even if a protocol, not employing the ACK, such as UDP/IP, is used, the number of clients, to whom services can be rendered, is not more than the order of thousands. Thus, if it is tried to provide data by streaming, server side costs are raised, such that the number of the clients is limited.

Recently, such a system has been proposed in which FEC (Forward Error Correction) is used as a multi-cast technique and in which data is transmitted to plural clients without requesting re-transmission of data. This system is such a one in which a server repeatedly transmits a stream by multi-cast and in which a client picks up necessary signals form the stream and decodes and reproduces the so picked up data.

In transmitting picture data of 500 motion pictures, each amounting to 2 Gbytes, within ten minutes, a transmission bandwidth of approximately 14.7 Gbits/sec is needed. If the same amount of the picture data is to be transmitted within one minute, the transmission bandwidth of approximately 147 Gbits/sec is needed. Although the above numerical values are theoretical values, the server that is able to withstand the capacity or the transmission system is extremely costly and, if such server is built, it is not practical. Although there is such a system in which data is distributed and recorded in a plural number of hosts, such a system is in need of increased processing for data management or data communication, because a huge amount of data has to be managed by plural servers.

DISCLOSURE OF THE INVENTION

In view of the above depicted status of the art, it is an object of the present invention to provide a data storage method and a data storage system in which a large amount of data can be distributed and managed without requiring complex processing or a huge transmission bandwidth, without burdening individual terminals, a data recording controlling apparatus for managing control in such a manner that a large amount of data can be distributed and recorded without requiring complex processing or a huge transmission bandwidth, without burdening individual terminals, and in such a manner that data can be taken out from the recording site, a data recording commanding apparatus in which a large amount of data can be distributed and recorded without requiring complex processing or a huge transmission bandwidth, without burdening individual terminals, a data receiving apparatus for receiving data distributed and recorded in individual terminals, and an information processing terminal that is able to distribute and record a large amount of data.

In one aspect, the present invention provides a data storage method for distributing and recording data in a plurality of information terminals interconnected over a network, comprising an encoding step for encoding blocked first data to generate blocked second data, a packetizing step of packetizing the second data, a recording probability generating step of generating a recording probability indicating whether or not the packet generated in the packetizing step is to be recorded in the plural information processing terminals, a transmission step of transmitting the packet and the recording probability to the plural information processing terminals, and a recording step of recording the packets in the information processing terminal based on the recording probability. The method includes, as processing for reading out the packet recorded in one or more of the plural information processing terminals with the recording probability, a response request data generating step of generating response request data with a response probability attached thereto for indicating whether or not the packet is to be responded, a transmission step of transmitting the response request data to the plural information processing terminals, and a response step of responding the packet in the plural information processing terminals based on the response probability.

In another aspect, the present invention provides a data storage system for distributing and recording data in a plurality of information terminals interconnected over a network, comprising a data recording controlling device, which data recording controlling device includes encoding means for encoding blocked first data to generate blocked second data, packetizing means for packetizing the second data, recording probability generating means for generating a recording probability indicating whether or not the packet generated in the packetizing step is to be recorded in the plural information processing terminals, and transmission means for transmitting the recording probability and the response request data to the plural information processing terminals, and a plurality of information processing terminals, which information processing terminals each include transmission/receipt means for transmitting/receiving the packet and the recording probability with the data recording controlling device, recording means for recording the packet, and controlling means for managing control whether or not the received packet is to be recorded based on the recording probability and whether or not the recorded packet is to be responded with the response probability. The aforementioned means are interconnected over a network.

In still another aspect, the present invention provides a data recording controlling apparatus for distributing and recording data in a plurality of information terminals interconnected over a network, in which the apparatus comprises encoding means for encoding blocked first data to generate blocked second data, packetizing means for packetizing the second data, recording probability generating means for generating a recording probability indicating whether or not the packet generated by the packetizing means is to be recorded in the plural information processing terminals, response request data generating means for generating response request data with a response probability attached thereto, the response probability indicating whether or not the packet is to be responded, transmission means for transmitting the packet including the recording probability and the response request data to the plural information processing terminals, and receiving means for receiving the packet sent from the terminals.

In still another aspect, the present invention provides a data recording commanding apparatus for distributing and recording data in a plurality of information terminals interconnected over a network, in which the apparatus comprises encoding means for encoding blocked first data to generate blocked second data, packetizing means for packetizing the second data, recording probability generating means for generating a recording probability indicating whether or not the packet generated in the packetizing means is to be recorded in the plural information processing terminals, and transmission means for transmitting the packet inclusive of the recording probability to the plural information processing terminals.

In still another aspect, the present invention provides a data receiving apparatus for receiving data from a plurality of information processing terminals interconnected over a network, in which the apparatus comprises response request data generating means for generating response request data with a response probability attached thereto, the response probability indicating whether or not a packet recorded in the plural information processing terminals is to be responded, transmitting means for transmitting the response request data to the information processing terminals, and receiving means for receiving the packet sent from the information processing terminals.

In yet another aspect, the present invention provides an information processing terminal comprising transmitting/receiving means for transmitting/receiving data with an external device connected thereto over a network, recording means for recording the packet, and controlling means for controlling whether or not the packet is to be recorded based on the recording probability attached to the packet and whether or not the recorded packet is to be responded with the response probability sent from the external device.

The above one and other aspects of the present invention are stated in the appended claims and hereinafter explained in detail with reference to the drawings.

BEST MODE FOR CARRYING OUT THE INVENTION

Figure 1:
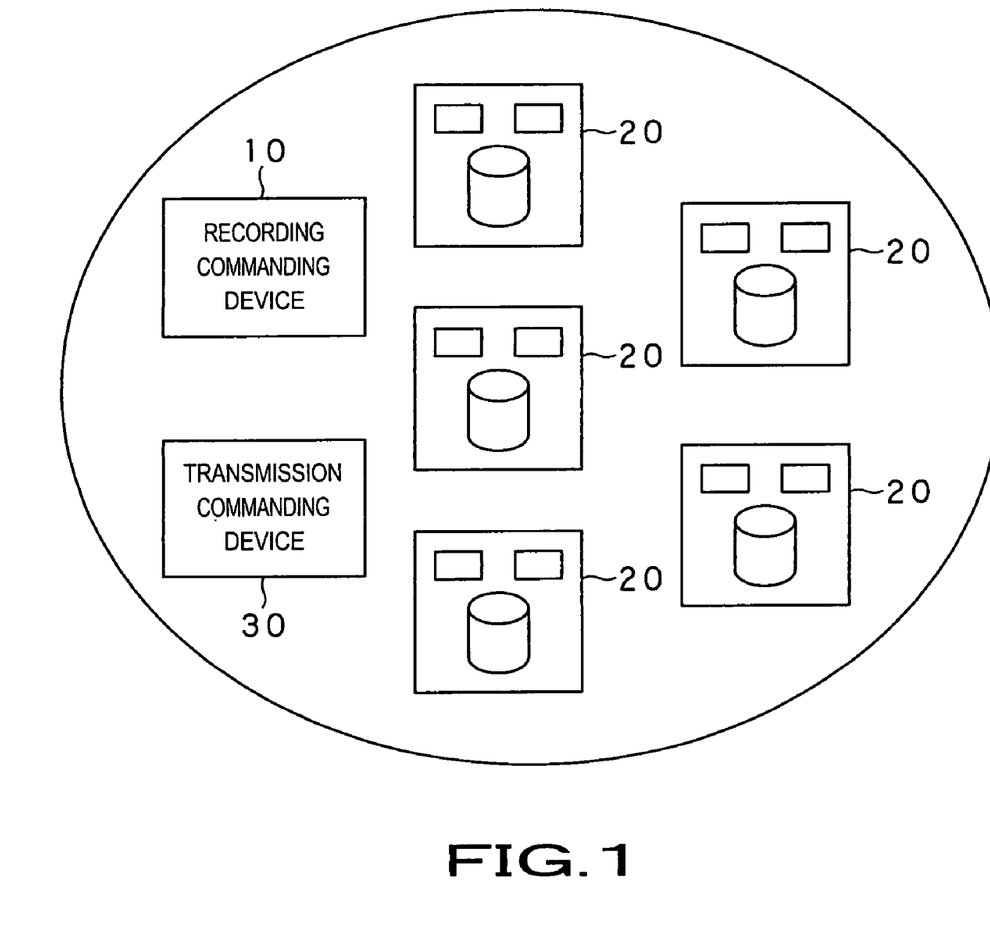
FIG. 1 shows a structure of a distributed storage system according to the present invention.

Referring to the drawings, certain specified embodiments of the present invention are explained in detail. FIG. 1 shows a specified embodiment of a distributed storage system in which data is distributed and recorded in plural terminals comprising a network. The distributed storage system includes n nodes $20_1, 20_2, \ldots, 20_{n-1}, 20_n$, interconnected in a mesh-like form, a recording commanding device 10 for commanding the distributing and recording of data in the respective nodes, and a transmission commanding device 30 for reading out the data recorded in the respective nodes. Although the recording commanding device 10, node 20 and the transmission commanding device 30 in the present specified embodiment are separate devices, the two devices may be combined to a sole recording transmission commanding apparatus having the functions of the respective devices. Or, the functions of the recording commanding device 10 and the transmission commanding device 30 may be provided on each node. In such case, the respective devices, comprising the network, may be used without distinctions.

Moreover, in FIG. 1, a transmission controlling apparatus, such as a router, forming the network, is not shown. However, in actuality, there is provided such a transmission controlling apparatus, e.g. a router, for selecting the channel of the packets traversing the node 20. This transmission controlling apparatus may be provided distinctly from the node 20, or the functions similar to those of the transmission controlling apparatus may be provided to the node 20.

Figure 2:
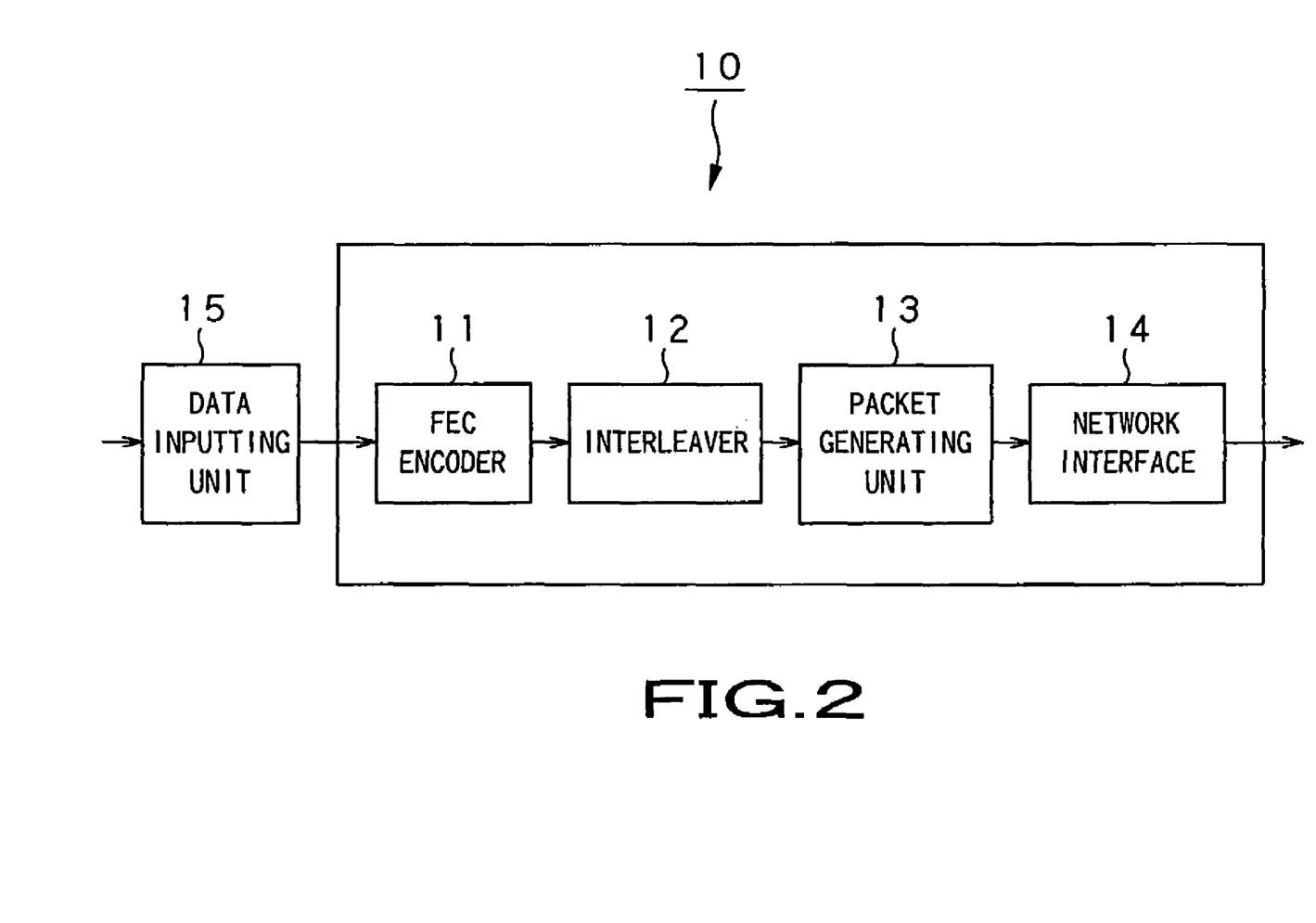
FIG. 2 shows an inner structure of a recording commanding apparatus.

The recording commanding device 10 is now explained. FIG. 2 shows the inner structure of the recording commanding device 10. The recording commanding device 10 includes an FEC (Forward Error Collection) encoder 11 for performing FEC encoding, an interleaver 12 for interleaving encoded data, a packet generating unit 13 for converting the data output from the interleaver 12 into a packet, and a network interface 14 for establishing connection to the network. The recording commanding device is supplied with data via a data inputting unit 15.

The FEC encoder 11 encodes input data using EFC encoding. It should be noted that the FEC encoding is a generic terminology of the encoding system performing error correction on the receiver side, such as tornado encoding system, read tornado encoding system or turbo encoding system. The FEC encoder 11 divides data input from the data inputting unit 15 into p blocks and applies FEC encoding to these p blocks for converting the p blocks into q blocks. This encoding from the p blocks to the q blocks is termed the encoding with the coding rate of q/p. By changing this coding rate q/p, it is possible to change the recording efficiency or the transmission efficiency of the present distributed storage system.

The interleaver 12 interchanges the sequence of the encoded data. By this re-arraying of the data sequence, carried out by the interleaver 12, data is distributed in such a manner that the burst errors produced by the packet loss is changed over to random errors.

Figure 3:
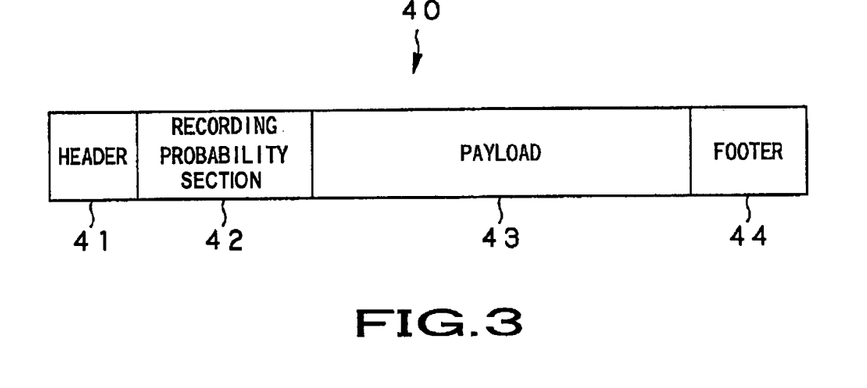
FIG. 3 shows a structure of a packet for storage of data for recording.

The packet generating unit 13 divides the data, transmitted from the interleaver 12, into predetermined size data, and appends the control information to the so split data to generate a packet. FIG. 3 shows the structure of a packet 40 generated by the packet generating unit 13. The packet 40 is made up by a header 41, a recording probability section 42, a payload 43 and a footer 44. In the payload 43, there is the transmission information converted by the FEC encoder 11. In the header 41 and in the footer 44, there is the control information including a data ID, specifying the sort of data, a check sum of CRC (Cyclic Redundancy Check), GUID (Global Unique ID) of the node 20 and a network address.

In the recording probability section 42, there is the recording probability $\alpha$ indicating the probability for the respective nodes, as later explained, to record this packet 40. A controller 22 of the node records a packet based on this recording probability $\alpha$.

Each and all nodes, comprising the distributed storage system, decide as to whether or not packets should be recorded, on the basis of the recording probability. In this manner, data are recorded with a probability a in the nodes comprising the distributed storage system. In this distributed storage system, data may be recorded with a uniform probability in the respective nodes in case the number of the nodes n is sufficiently large and also in case a sufficient large the number of blocks q have been decoded.

A network interface 14 is supplied with packetized data and transmits the data with a uncast or a multicast to each node 20.

Figure 4:
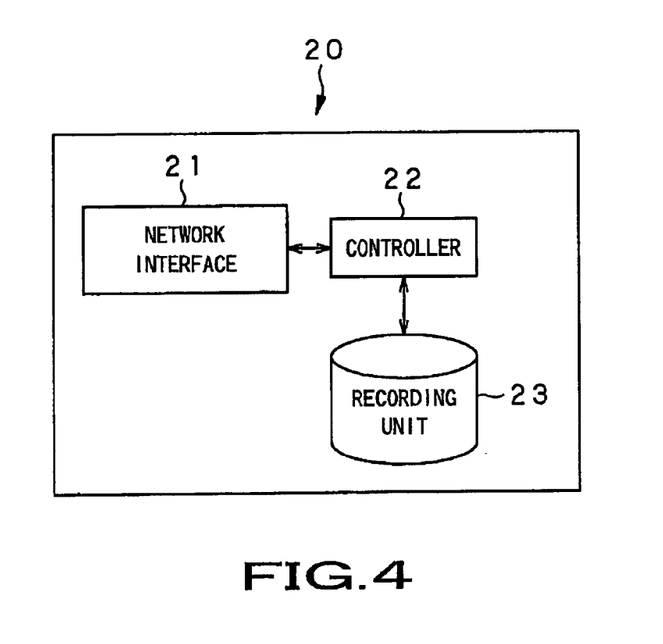
FIG. 4 shows an inner structure of a node.

The structure of the node 20 is now explained. FIG. 4 shows the structure of the node 20. The node 20 includes a network interface 21, a controller 22 and a recording unit 23, and is connected to the network over the network interface 21.

The controller 22 executes recording processing for recording an input packet 40 in the recording unit 23 and a responding processing for responding the data responsive to a request from the other node 20.

The recording processing is the processing of verifying whether or not the packet 40 is to be recorded in the recording unit 23, based on the recording probability a for the input packet 40. It should be noted that the packets are uniformly recorded in the totality of the nodes in case the number of the nodes n comprising the distributed storage system is sufficiently large and also in case a sufficient large number q of the blocks have been decoded, such that the data is recorded with the probability a insofar as the entire distributed storage system is concerned.

The responding processing is the processing which commences on receipt of a packet requesting the transmission of data sent from a transmission commanding device. The data structure of this data transmission request packet will be explained later. Briefly, this packet states a probability of responding data $\beta$ and the controller 22 responds the recorded data with a probability $\beta$. When it is determined that the data should be responded, the controller 22 retrieves target data to generate a response packet.

Figure 5:
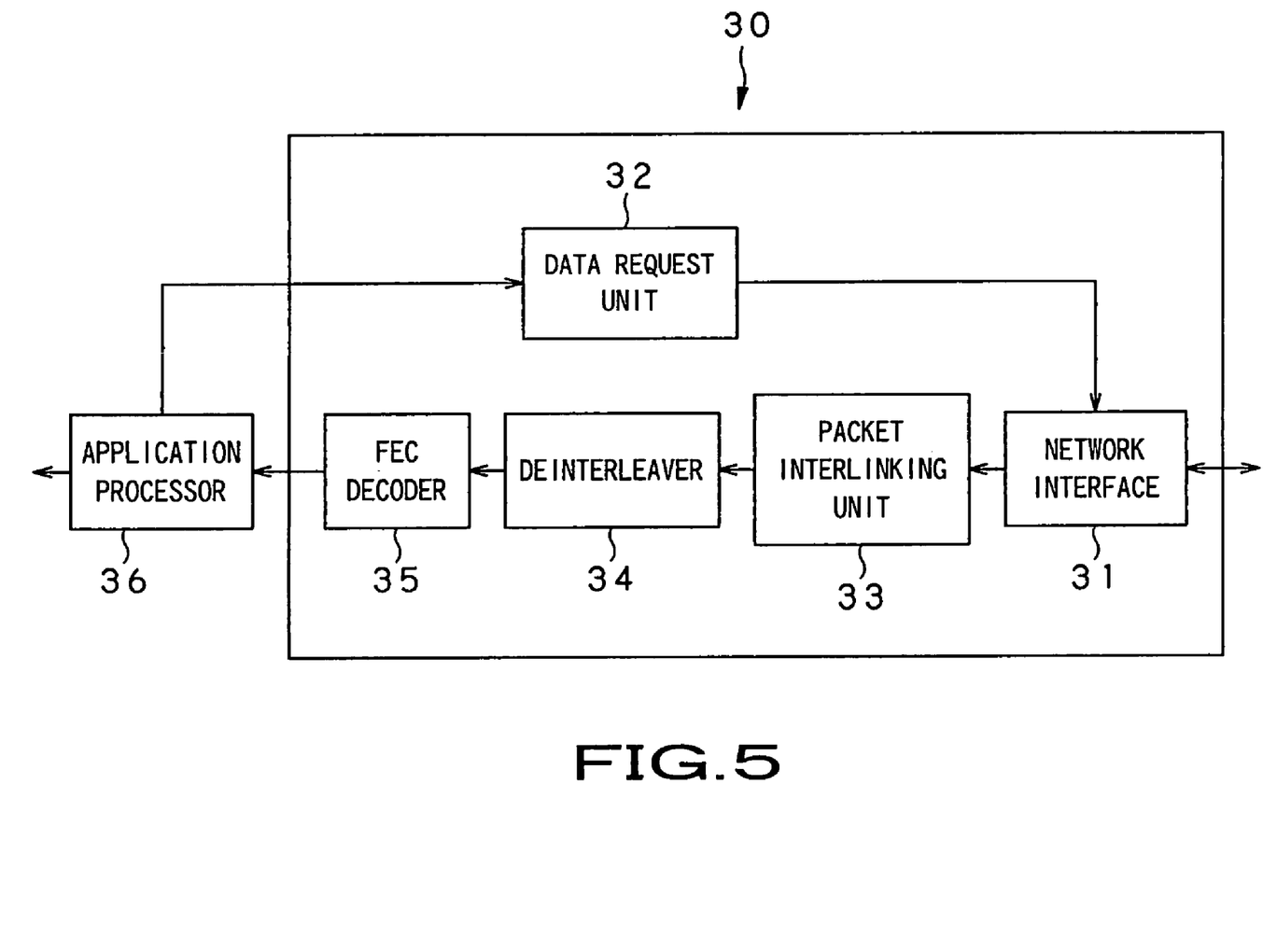
FIG. 5 shows an inner structure of a transmission commanding apparatus.

The transmission commanding device 30 is now explained. FIG. 5 shows its structure. Specifically, the transmission commanding device 30 includes a network interface 31 for transmitting/receiving data with outside over a network, a data request unit 32 for requesting a node to transmit data, a packet interlinking unit 33 for interlinking data split into packets, a deinterleaver 34, and an FEC decoder 35. The decoded data is entered to an application processor 36 so as to be output to external equipment, such as a monitor or a loudspeaker, not shown, or so as to be stored in a recording device, not shown.

Figure 6:
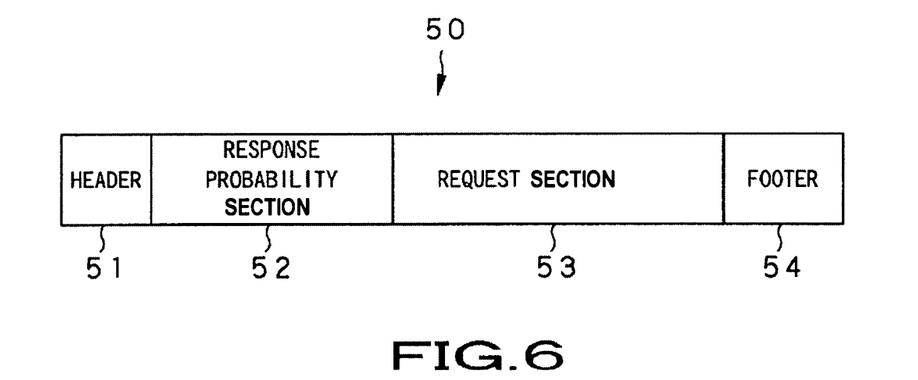
FIG. 6 shows a structure of a packet for requesting data transmission.

The data request unit 32 transmits a packet for requesting data to each node comprising the distributed storage system. FIG. 6 shows the structure of a packet 50 requesting data. The packet 50 is made up by a header 51, a response probability section 52, a request section 53 and a footer 54. In the request section 53, there is a data ID for discriminated the request data. In the header 51 and the footer 54, there is the control information, including the CRC check sum, a network address of a node, and a GUID or the sequence number specifying the data sequence.

In the response probability section 52, a response probability $\beta$ is recorded. The response probability $\beta$ is a variable for verifying whether or not the node which has received the packet 50 is to response data. Based on this variable, a certain node may decide that the data should be responded, while another node may decide that the data should not be responded. It is noted that the response probability $\beta$ is a value which holds when the distributed storage system is viewed macroscopically, that is, the data responding probability $\beta$ is insofar as the overall distributed storage system is concerned. Thus, should there exist n nodes 20 in the overall distributed storage system, the number of the packets responded is the product of the number n of the nodes 20 and the response probability $\beta$, or $n \times \beta$.

Figure 7:
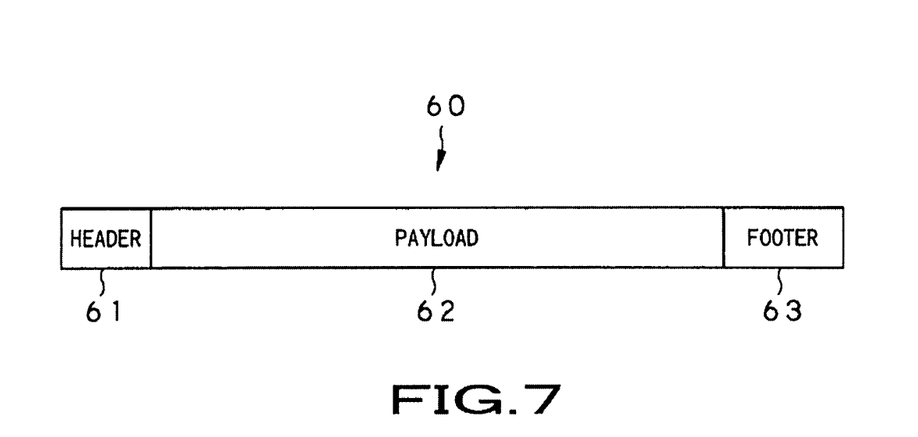
FIG. 7 shows a structure of a packet responded from the node.

The packet interlinking unit 33 interlinks the packets responded from the nodes 20. FIG. 7 shows the data structure of a packet 60 responded from the node. Referring to FIG. 7, the packet 60 is made up by a header 61, a payload 62 and a footer 63. In the payload 62 is stored data to be responded. In the header 61 and the footer 63, there is stored the control information, such as CDC check sum, a network address of a node, or the sequence number specifying the data sequence.

On receipt of the packets 60 of FIG. 7, the packet interlinking unit 33 reads out the sequence number and interchanges the sequence of the packets 60, eliminates the control information, such as the header 61 or the footer 63, and interlinks the packets in the order of the sequence number.

The deinterleaver 34 deinterleaves the interlinked packets to put the data array in order. The FEC decoder 35 FEC-decodes the deinterleaved data to restore the original data.

The data decoded by the FEC decoder 35 is output to the application processor 36. This application processor 36 stores the decoded data in a recording unit, not shown, or outputs the decoded data to an input/output interface, such as a monitor or a loudspeaker.

Thus, the distributed storage system of the present specified embodiment is a system for recording data in respective nodes with a recording probability a and for responding the data recorded in the respective nodes with the response probability $\beta$. The original data, output from the recording commanding device 10, is responded with a rate of $\alpha \times n \times \beta$. For example, if p blocks are coded to q blocks, $q \times \alpha \times n \times \beta$ blocks are responded. If the number of the responded blocks is larger than the number p of the blocks prior to coding, data can be decoded, as stated in a treatise RIZZ097, which will be stated subsequently. Thus, by determining the values of $\alpha$, $\beta$ and q/p, so that the number of the responded blocks is more than p, it is possible to decode the targeted data.

The operation of the distributed storage system is now explained with reference to FIGS. 8 to 12. First, the data recording operation is explained. In recording the data, the recording commanding device 10 enters target data from the data inputting unit 15, and outputs the input data to the FEC encoder 11.

Figure 8A:
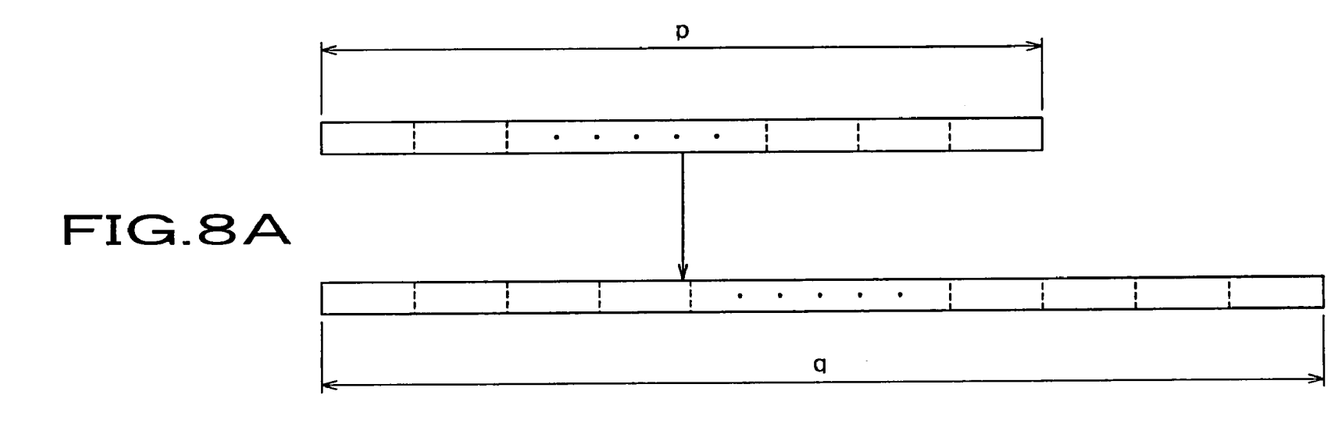
FIGS. 8A and 8B show the process for generating a packet.
Figure 8B:
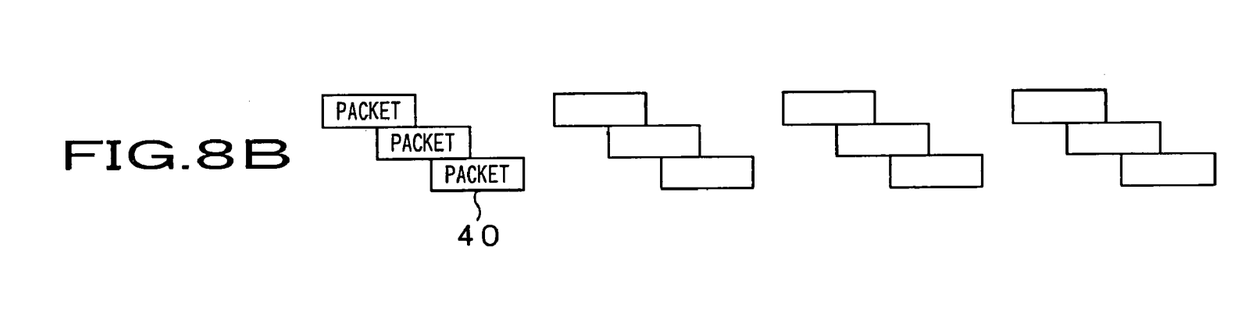

The FEC encoder 11 splits the input data into p blocks, as shown in FIG. 8B. The FEC encoder 11 then applies FEC coding, with a coding rate of q/p, for converting the data, split into p blocks, into q encoded blocks.

As indicated in the foregoing, the FEC encoding is a generic terminology of the encoding system performing error correction on the receiver side, such as tornado encoding system, read tornado encoding system or turbo encoding system. If, when a given data is coded with the coding rate q/p, there are left not less than q encoded blocks, the original data can be restored, even though several blocks are lost by loss, as publicized in a treatise RIZZ097 (http://www.iet.unipi.it/~luigi/fec.html#fec.ps).

The FEC-coded data are output to the interleaver 12, which interleaver 12 then re-arrays the sequence of the coded data to distribute the data. The data, output from the interleaver 12, is routed to the packet generating unit 13. The packet generating unit 13 splits the distributed data to a predetermined size and appends the header or the footer to the split data to generate a packet 40 shown in FIG. 8B.

Figure 9:
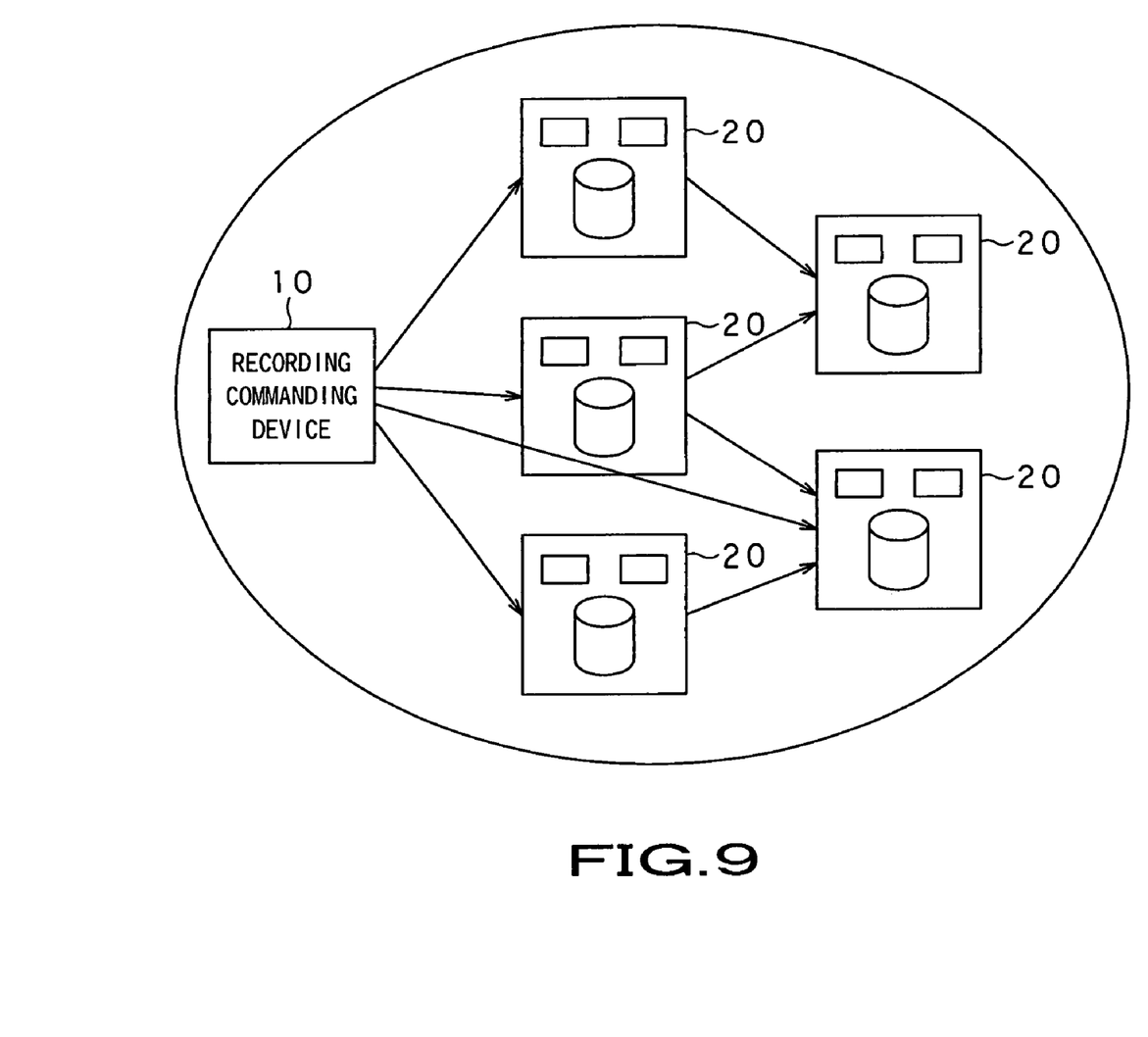
FIG. 9 shows a transmission channel for a packet including data for recording.

The packet 40, generated as described above, is routed to the network interface 14. The network interface 14 transmits the packetized data to each node of the distributed storage system, using a uncast or a multi-cast, as shown in FIG. 9.

The node which has received the packet 40, sent from the recording commanding device 10, commences the recording processing and reads out the recording probability a of the packet 40 to decide whether or not the packet 40 is to be recorded. If it is determined that the packet is to be recorded, the node records the data in the recording unit 23 and, if it is determined that the packet is not to be recorded, the node outputs the received packet to other nodes. It is noted that the recording probability $\alpha$ is a value indicating how much data is to be recorded in the distributed storage system in its entirety. Thus, should the transmitted data be q encoding blocks, q×$\alpha$ data are recorded in the distributed storage system in its entirety.

Figure 10:
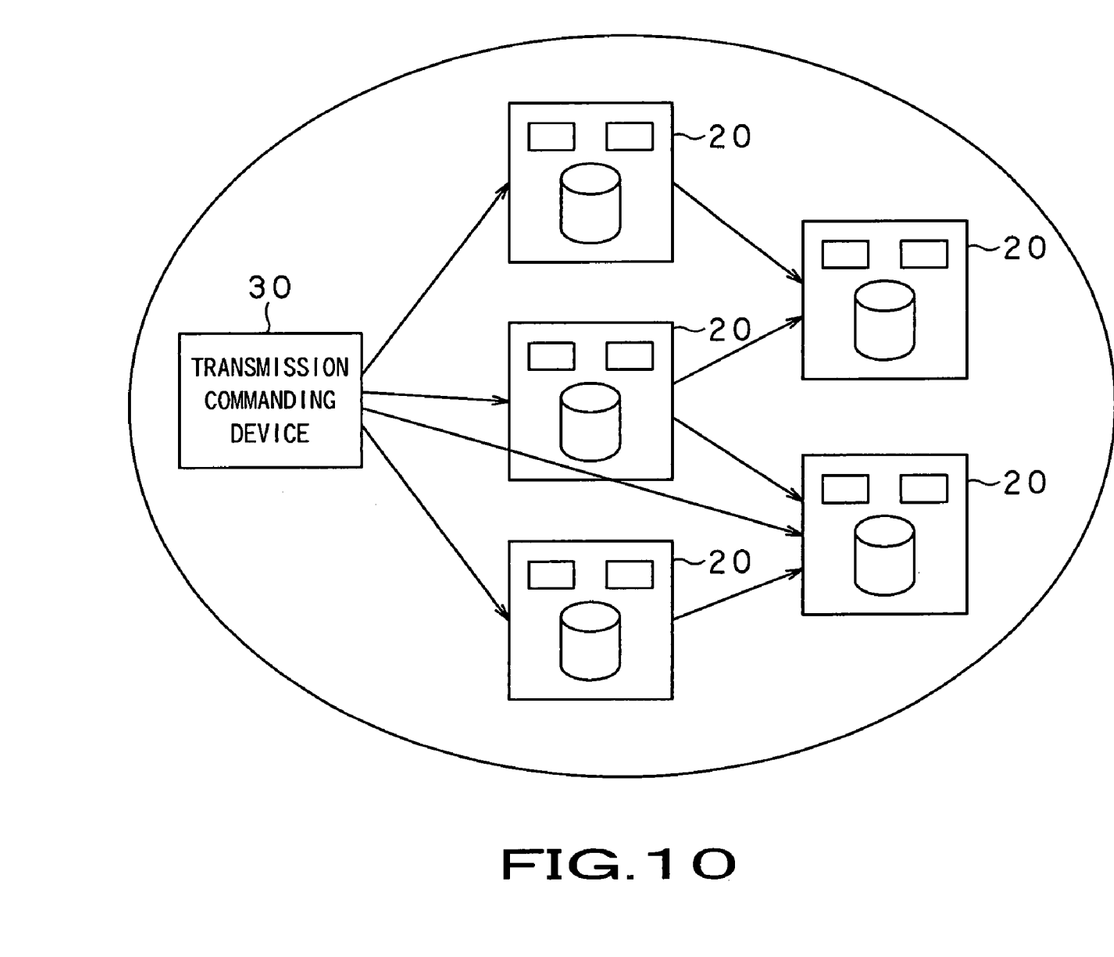
FIG. 10 shows a transmission channel for a packet requesting response of data.

The processing of taking out the data is hereinafter explained. When taking out the data, the transmission commanding device 30 generates a packet 50 and outputs the packet 50 to respective nodes, using a uncast or a multi-cast, as shown in FIG. 10.

On receipt of the packet 50, the node commences the response processing. In the packet 50, a data ID for discriminating the data and the response probability $\beta$ in responding the packet, are stated, in addition to the usual control information, in the packet 50. Thus, in the responding processing, the node determines whether or not data is to be responded, based on the response probability $\beta$ of the packet 50. If it is determined that the data is to be responded, the controller 22 of the node generates a packet 60, including the data, and transmits the so generated packet to the transmission commanding device 30. If it is determined that no data is to be responded, the node controller 22 performs no processing.

Figure 11:
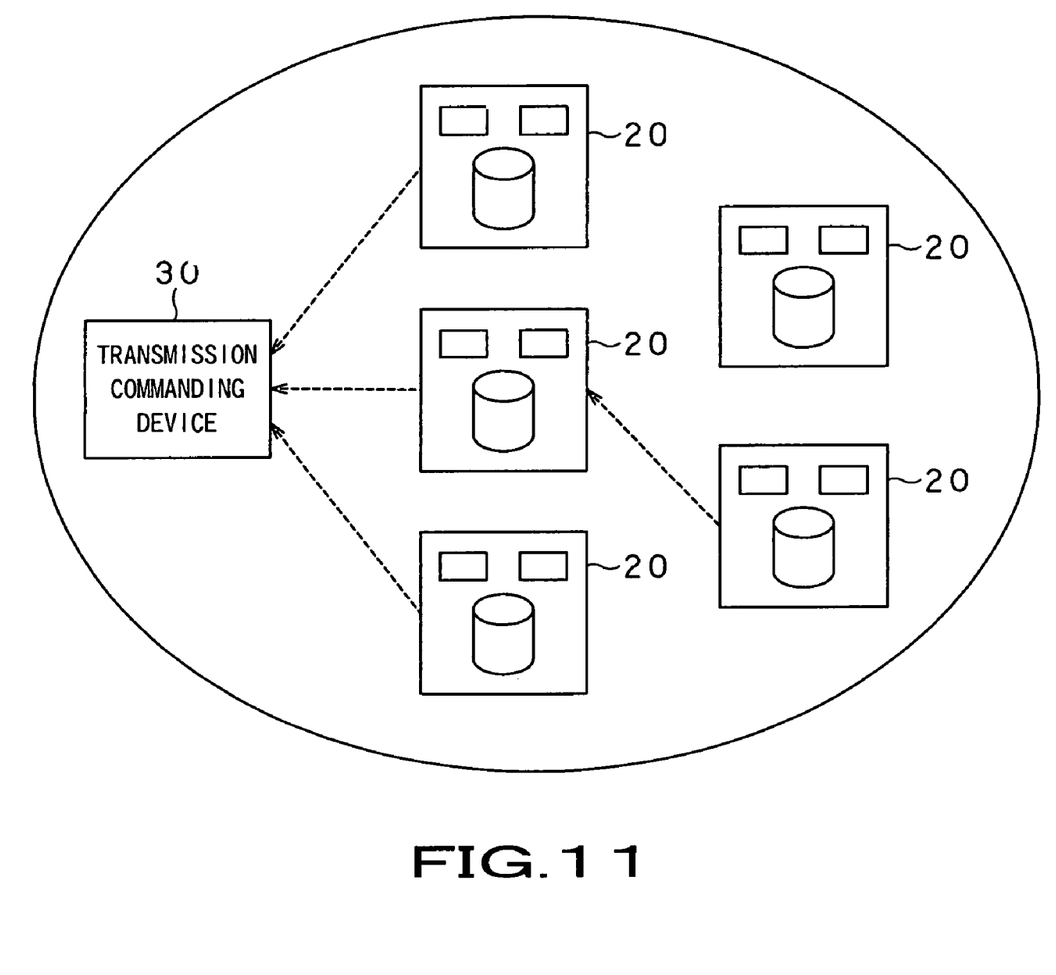
FIG. 11 shows a transmission channel for a packet responded from the node to the transmission commanding apparatus.

FIG. 11 shows the manner of responding the packet from each node to the transmission commanding device 30. Referring to FIG. 11, the nodes of the distributed storage system may or may not respond data. However, on the whole, each node responds data with a response probability $\beta$. If there exist n nodes in the distributed storage system, each node responds the data at a rate of n×$\beta$ on the whole. Since q×$\alpha$ data have been recorded in the distributed storage system, as described above, based on the recording probability $\alpha$, q×$\alpha$×n×$\beta$ data are responded.

Figure 12A:
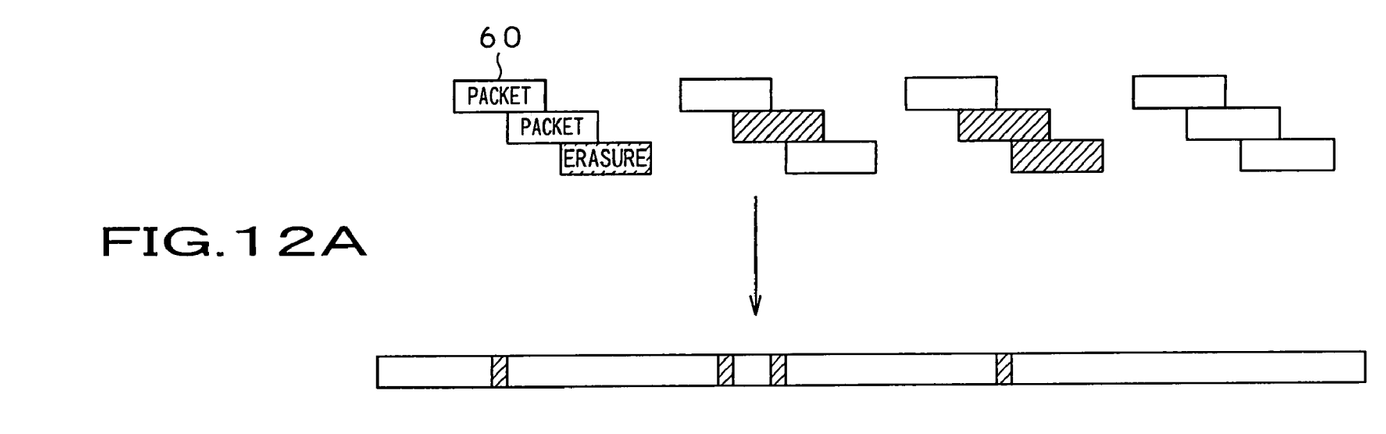
FIGS. 12A and 12B show the process of restoring the packet transmitted from the node to original data.
Figure 12B:
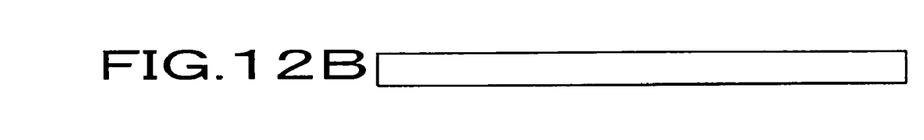

Referring now to FIG. 12, the decoding of the data is explained. On receipt of the data, transmitted from the respective nodes, the transmission commanding device 30 enters the received data to the packet interlinking unit 33 to interlink the packets. FIG. 12A shows packets 60 being responded from the nodes to the to the transmission commanding device 30. In FIG. 12A, the locations shown shaded indicate the locations where data loss has occurred. In the distributed storage system, since the original data is responded at a rate of $\alpha$×n×$\beta$, not all packets are responded, such that several packets are erased, as shown in FIG. 12A.

However, these data have been interleaved, so that, on deinterleaving, burst-like data loss is converted by distribution into random data loss. These data may be FEC coded to restore the original data shown in FIG. 12B.

In the FEC encoding, if data is encoded with the coding rate of q/p, and there exist not less than p blocks of the encoded data, data decoding is possible. When the transmitted q data are responded at a rate of $\alpha$×n×$\beta$, the number of the responded data is q×$\alpha$×n×$\beta$. The original data can be restored by setting the values of q/p, $\alpha$ and $\beta$ so that this number q×$\alpha$×n×$\beta$ is not less than p.

Moreover, in the present specified embodiment, since it is sufficient if the coding rate q/p, recording probability $\alpha$ and the response probability $\beta$ are set to satisfy the relation of q×$\alpha$×n×$\beta$>p, the data recording efficiency or the transmission efficiency can be changed by changing the coding rate q/p, recording probability $\alpha$ and the response probability $\beta$ insofar as the above relation is met. In the following, setting examples for the parameters q/p, $\alpha$ and $\beta$ are explained.

For example, if the value of the recording probability $\alpha$ is enlarged and that of the response probability $\beta$ is decreased, for data for which an extremely large number of response requests have been made, the data transmitted from the respective nodes is decreased, such as to simplify data retrieving processing or data transmission processing in each node.

It is similarly possible to enlarge the value of the coding rate q/p and to decrease the response probability $\beta$, instead of enlarging the value of the recording probability $\alpha$, to simplify data retrieving processing or data transmission processing in each node.

Moreover, the number of the packets transmitted may be suppressed by reducing the coding rate q/p and by increasing the recording probability $\alpha$. This is effective when p is sufficiently large. On the other hand, recording the same packet in plural nodes may be avoided by decreasing the recording probability $\alpha$ and reducing the coding rate q/p. This is effective when the value of p is sufficiently small.

By enlarging the response probability $\beta$ and by decreasing the recording probability a or the coding rate q/p, it is possible to decrease the capacity of the encoded data recorded in the distributed storage system in its entirety. Or, during data recording, outputting or transmission, a sufficient number of data can be responded by controlling the values of $\alpha$, $\beta$ or q/p so that the value of $\alpha$×n×$\alpha$×q×$\beta$ is sufficiently larger than p, where a is the probability of packet loss.

By mathematically estimating the number of unique packets responded from plural nodes, and enlarging the recording probability, response probability or the coding rate, it is possible to raise the probability of the oncoming of a unique packet.

With the distributed storage system of the present specified embodiment, described above, data may be distributed and recorded by transmitting a packet 40, stating the recording probability α, to the nodes comprising the system. Data may be taken out by causing the data recorded in the node to be responded at a response probability β. By distributing and recording the data in this manner, data can be stored without concentrating the data management load in one server. Additionally, with the distributed storage system of the present specified embodiment, in which given data is co-owned by plural nodes, the data volume needed in the overall system may be reduced.

By receiving data from plural nodes, data transmission/receipt may be carried out with a stable traffic, without heavy inbound traffic in one server.

By changing the values of α, β or q/p, it is possible to change the transmission efficiency or the volume of recorded data. Moreover, on packet loss such as at the time of data recording, outputting or transmission, the values of the parameters α, β or q/p may be changed, taking the loss probability a into account, such that an amount of data sufficient for decoding can be taken out even on the occasion of packet loss.

Moreover, with the present distributed storage system, in which distributed recording and readout may be achieved by calculations which are based on the recording probability and the response probability, data management is simpler, such that the household appliances with a low processing capability, such as camcorder or a mobile phone, can be adapted to the present system. Additionally, since the household appliances with a low processing capability, such as camcorder or a mobile phone, can be used as a node, a distributed storage system of millions of nodes can be constructed extremely readily.

In the above-described distributed storage system, the transmission commanding device transmits data for recording and the recording probability by the same packet. Alternatively, the data for recording and the recording probability may be transmitted by different packets, or recorded in an exterior recording device, so as to be referred to from respective information processing nodes.

The above-described specified examples are merely illustrative of the present invention such that the present invention encompasses modifications that come under the scope of the purport of the invention. For example, although a camcorder, a personal video recorder or a home gateway may be thought of as nodes, any other suitable device, having a recording unit for recording data, a controller for permitting predetermined calculations and a network interface permitting data transmission/receipt, may also be used as a node.

Although the recording probability α and the response probability β are recorded in the packet, it is also possible to record the recording probability a and the response probability β in an optional recording device or in a packet and the so recorded data may be referred to by each node. In particular, if the read tornado coding system is used as FEC coding, the interleaving processing can be omitted.

The present invention is not limited to the embodiments described with reference to the drawings and, as may be apparent to those skilled in the art, various changes, substitutions or equivalents may be envisaged without departing from the scope and the purport of the invention as defined in the appended claims.

INDUSTRIAL APPLICABILITY

With the data storage method according to the present invention, described above, the second data, obtained on encoding first data, is formed into packets, a recording probability indicating whether or not each packet is to be recorded in the plural information processing terminals is generated and the recording probability as well as the packets is sent to the plural information terminals. For reading out the packets recorded in any of the information processing terminals with this recording probability, response request data, with a response probability attached thereto for indicating whether or not the packet is to be responded, is generated and transmitted to plural information processing terminals. The information processing terminals respond the packet based on the response probability. In this manner, a large quantity of data may be distributed and recorded without requiring complex processing or huge transmission bandwidth without loading the individual terminal, while the data can be taken out from the recorded location for data re-construction.

With the data storage system, according to the present invention, the second data, obtained on encoding first data, is formed into packets, a recording probability indicating whether or not each packet is to be recorded in the plural information processing terminals is generated and the recording probability as well as the packets is sent to the plural information terminals. For reading out the packets recorded in any of the information processing terminals with this recording probability, response request data, with a response probability attached thereto for indicating whether or not the packet is to be responded, is generated and transmitted to plural information processing terminals. The information processing terminals then respond the packet based on the response probability. In this manner, a large quantity of data may be distributed and recorded without requiring complex processing or a huge transmission bandwidth without loading the individual terminal, while the data can be taken out from the recorded location for data re-construction.

With the data recording controlling apparatus, according to the present invention, a large quantity of data may be distributed and recorded without requiring complex processing or a huge transmission bandwidth without loading the individual terminal, while data may be taken out from the recording location for re-construction.

With the data recording commanding apparatus, according to the present invention, a large quantity of data may be distributed and recorded without requiring complex processing or a huge transmission bandwidth without loading the individual terminal.

With the data receiving apparatus, the data distributed and recorded in individual terminals can be received and reconstructed without requiring complex processing or huge transmission bandwidth.

Moreover, with the information processing terminal according to the present invention, a large quantity of data can be distributed and recorded without requiring complex processing or huge transmission bandwidth.

What is claimed is:

1. A data storage method for distributing and recording data in a plurality of information processing terminals interconnected over a network, the method comprising:

encoding first data to generate second data, the first data having a first number of blocks and the second data having a second number of blocks;

packetizing the second data into a plurality of packets;

generating a recording probability indicating a probability of the plurality of information processing terminals recording the plurality of packets;

transmitting the plurality of packets and the recording probability to the plurality of information processing terminals;

recording the plurality of packets in the plurality of information processing terminals based on the recording probability;

generating response request data including a response probability indicating a probability of the plurality of information processing terminals transmitting the plurality of packets;

transmitting the response request data to the plurality of information processing terminals; and responding to the response request data by transmitting the plurality of packets recorded in the plurality of information processing terminals based on the response probability.

2. The data storage method according to claim 1, wherein the recording probability is included in the plurality of packets transmitted to the plurality of information processing terminals.

3. The data storage method according to claim 1, wherein the recording probability is transmitted to the plurality of information processing terminals in a recording probability packet separate from the plurality of packets.

4. The data storage method according to claim 1, wherein a number of packets transmitted in response to the response request data is the same as or larger greater than or equal to the first number of blocks.

5. The data storage method according to claim 4, further comprising changing at least one of a ratio of the first number of blocks and the second number of blocks, the recording probability, and the response probability to control the distribution of the plurality of packets.

6. The data storage method according to claim 5, further comprising changing at least one of the recording probability, the response probability, a number of information processing terminals, and the second number of blocks such that a product of the recording probability, the response probability, the number of information processing terminals, and the second number of blocks greater than or equal to the first number of blocks.

7. The data storage method according to claim 6, further comprising changing at least one of a data loss probability of the network, the recording probability, the response probability, the number of information processing terminals, and the second number of blocks such that a product of the data loss probability of the network, the recording probability, the response probability, the number of information processing terminals, and the second number of blocks greater than or equal to the first number of blocks.

8. The data storage method according to claim 5, further comprising changing at least one of a the probability of the plurality of information processing terminals not responding to the response request data, the recording probability, the response probability, a number of information processing terminals, and the second number of blocks such that a product of the probability of the plurality of information terminals not responding, the recording probability, the response probability, the number of information processing terminals, and the second number of blocks of is greater than or equal to the first number of blocks.

9. The data storage method according to claim 1, further comprising increasing at least one of the recording probability, the response probability, and a coding rate to lower a probability of transmitting overlapping packets in response to the response request data, wherein the coding rate is a ratio of the first number of blocks and the second number of blocks.

10. A data storage system for distributing and recording data in a plurality of information processing terminals, the system comprising:

a data recording controlling device including:

encoding means for encoding first data to generate second data, the first data having a first number of blocks and the second data having a second number of blocks;

packetizing means for packetizing the second data into a plurality of packets;

recording probability generating means for generating a recording probability indicating a probability of the plurality of information processing terminals recording the plurality of packets;

response request data generating means for generating response request data including a response probability indicating a probability of the plurality of information processing terminals transmitting the plurality of packets to the data recording controlling device in response to the response reguest data;

transmission means for transmitting the plurality of packets, the recording probability, and the response request data including the response probability to the plurality of information processing terminals; and receiving means for receiving the plurality of packets transmitted from the plurality of information processing terminals in response to the response reguest data;

the information processing terminals including:

communication means for receiving the plurality of packets, the recording probability, and the response reguest data including the response probability from the data recording controlling device and for transmitting the plurality of packets to the data recording controlling device;

recording means for recording the plurality of packets; and controlling means for controlling whether or not the received plurality of packets are to be recorded based on the recording probability and for controlling whether or not the recorded plurality of packets are to be transmitted to the data recording controlling device in response to the response request data based on the response probability, wherein the data recording controlling device and the plurality of information processing terminals are interconnected over a network.

11. The data storage system according to claim 10, wherein the recording probability is included in the plurality of packets transmitted to the plurality of information processing terminals.

12. The data storage system according to claim 10, wherein the recording probability is transmitted to the plurality of information processing terminals in a recording probability packet separate from the plurality of packets.

13. The data storage system according to claim 10, wherein a number of packets received in the receiving means of the data receiving controlling device is the came as or larger greater than or equal to the first number of blocks.

14. The data storage system according to claim 13, further comprising a packet distribution controlling means for changing at least one of a ratio of the first number of blocks and the second number of blocks the recording probability, and the response probability to control the distribution of the plurality of packets.

15. The data storage system according to claim 14, wherein, packet distribution controlling means, changes at least one of the recording probability, the response probability, a number of information processing terminals, and the second number of blocks such that a product of the recording probability, the response probability, the number of information processing terminals, and the second number of blocks greater than or equal to the first number.

16. The data storage system according to claim 15, wherein the packet distribution controlling means changes at least one of a data loss probability of the network the recording probability, the response probability, the number of information processing terminals, and the second number of blocks such that a product of the data loss probability of the network, said the recording probability, the response probability, the number of information processing terminals and the second number of blocks greater than or equal to the first number of blocks.

17. The data storage system according to claim 14, wherein the packet distribution controlling means, changes at least one of a probability of the plurality of information processing terminals not responding to the response request data the recording probability, the response probability, a number of information processing terminals, and the second number of blocks such that a product of the probability of the plurality of information processing terminals not responding, the recording probability, the response probability, the number of information processing terminals, and the second number of blocks greater than or equal to the first number of blocks data.

18. The data storage system according to claim 10, wherein, at least one of the recording probability generating means, the response request data generating means, and the encoding means increases at least one of the recording probability, the response probability and a coding rate to lower a probability of transmitting overlapping packets to the data recording controlling device by the plurality of information processing terminals in to the response request data, wherein the coding rate is a ratio of the first number of blocks and the second number of blocks.

19. A data recording controlling apparatus for distributing and recording data in a plurality of information processing terminals interconnected over a network, the apparatus comprising;

encoding means for encoding first data to generate second data;

packetizing means for packetizing said the second data into a plurality of packets;

recording probability generating means for generating a recording probability indicating a probability of the plurality of information processing terminals recording the plurality of packets;

response request data generating means for generating response request data including a response probability indicating a probability of the plurality of information processing terminals transmitting the plurality of packets to the data recording controlling apparatus in response to the response request data;

transmission means for transmitting the plurality of packets, the recording probability, and the response request data including the response probability to the plurality of information processing terminals; and receiving means for receiving the plurality of packets transmitted from the plurality of information processing terminals in response to the response reguest data.

\* \* \* \* \*